(12) United States Patent
Nowak et al.

(10) Patent No.: US 7,345,334 B2
(45) Date of Patent: Mar. 18, 2008

(54) INTEGRATED CIRCUIT (IC) WITH HIGH-Q ON-CHIP DISCRETE CAPACITORS

(75) Inventors: Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,081

(22) Filed: Apr. 27, 2005

(65) Prior Publication Data

US 2006/0244061 A1 Nov. 2, 2006

(51) Int. Cl.
*H01L 29/72* (2006.01)

(52) U.S. Cl. .................. 257/301; 257/306; 257/347; 257/532

(58) Field of Classification Search .......... 257/347, 257/301, 306, 532
See application file for complete search history.

(56) References Cited

U.S. PATENT DOCUMENTS

| | | | |
|---|---|---|---|
| 5,770,875 A * | 6/1998 | Assaderaghi et al. ....... 257/301 |
| 6,236,103 B1 | 5/2001 | Bernstein et al. | |
| 6,337,253 B1 | 1/2002 | Davari et al. | |
| 6,627,954 B1 * | 9/2003 | Seefeldt ....................... 257/350 |
| 6,777,304 B2 | 8/2004 | Assaderaghi et al. | |
| 6,787,430 B2 | 9/2004 | Kanamori | |
| 2002/0153590 A1 | 10/2002 | Kunikiyo | |
| 2003/0045069 A1 | 3/2003 | Gilgen et al. | |
| 2004/0067614 A1 | 4/2004 | Hidaka et al. | |
| 2004/0248363 A1 * | 12/2004 | Bard et al. .................. 438/243 |

* cited by examiner

*Primary Examiner*—Edward Wojciechowicz
(74) *Attorney, Agent, or Firm*—Law Office of Charles W. Peterson, Jr.; Anthony Canale

(57) ABSTRACT

A semiconductor structure that may be a discrete capacitor, a Silicon On Insulator (SOI) Integrated Circuit (IC) including circuits with discrete such capacitors and/or decoupled by such discrete capacitors and an on-chip decoupling capacitor (decap). One capacitor plate may be a well (N-well or P-well) in a silicon bulk layer or a thickened portion of a surface silicon layer. The other capacitor plate may be doped polysilicon and separated from the first capacitor plate by capacitor dielectric, e.g., CVD or thermal oxide. Contacts to each of the capacitor plates directly connect and extend from the respective plates, such that direct contact is available from both plates.

7 Claims, 4 Drawing Sheets

INTEGRATED CIRCUIT (IC) WITH HIGH-Q ON-CHIP DISCRETE CAPACITORS

BACKGROUND OF THE INVENTION

1. Field of the Invention

The present invention is related to on-chip capacitors for Integrated Circuit (IC) chips and more particularly to integrated circuit chips with discrete capacitors on-chip.

2. Background Description

Integrated Circuits (ICs) are commonly made in the well-known complementary insulated gate Field Effect Transistor (FET) technology known as CMOS. Typical high performance ICs include CMOS devices (FETs) formed in a number of stacked layers (e.g., wiring, via, gate and gate dielectric) on a surface semiconductor (silicon) layer of a Silicon On Insulator (SOI) chip or wafer. CMOS technology and chip manufacturing advances have resulted in a steady decrease of chip feature size to increase on-chip circuit switching frequency (circuit performance) and the number of transistors (circuit density). In what is typically referred to as scaling, device or FET features are shrunk to shrink corresponding device minimum dimensions, including both horizontal dimensions (e.g., minimum channel length) and vertical dimensions, e.g., channel layer depth, gate dielectric thickness, junction depths and etc. Shrinking device size increases device density and improves circuit performance (both from increased device drive capability and decreased capacitive load). Scaling also entails thinning the surface device layer to control device threshold roll off. Especially in Ultra-Thin SOI (UTSOI), thinning the surface device layer has resulted in devices with fully depleted bodies (i.e., in what is known as Fully Depleted SOI or FD-SOI). Scaled FD-SOI devices can have substantially higher series resistance, as well as substantially higher capacitance.

Further, these CMOS circuits create current spikes from switching primarily capacitive FET circuit loads through impedance in the circuit/chip supply path. These current spikes may be reflected as noise on the chip supply that is known as supply or $V_{dd}$ noise. High speed circuit switching may cause larger, narrower current spikes with very rapid rise and fall times. While scaling has increased device density with more devices/function per unit area, scaling has also resulted in, correspondingly, more devices switching per unit area at a significantly higher frequency. Supply noise can reduce circuit drive (i.e., because the circuit supply is reduced during such a supply spike) and even, under some circumstances, pass through to the output of a quiescent gate to appear that the gate is switching rather than quiescent. Since circuit switching is typically time varying, e.g., from clock cycle to clock cycle, the resulting noise also varies from cycle to cycle that can cause circuit responses to vary also with supply noise. Consequently, supply noise is a major chip design concern.

Decoupling capacitors (decaps), which are well known in the art, are used liberally at board level to reduce supply noise to a tolerable level. Decaps are small, low-resistance (high-Q), high-frequency capacitors, placed close to circuits being decoupled to reduce resistive losses, e.g., adjacent a module on a printed circuit board, adjacent a chip on a module, adjacent a circuit on a chip, and etc. Thus, decaps short circuit switching current at the module, chip or circuit. Unfortunately, prior art on-chip decaps are less effective in UTSOI due to higher series resistance.

Neither have such prior art on-chip capacitors been particularly suited to typical analog applications. Analog circuits frequently include discrete capacitors. A voltage controlled oscillator (VCO) in a phase-locked loop (PLL), for example, includes a capacitor in an RC filter to develop and filter a control voltage derived from the output frequency. The RC must have a time constant at least twice the VCO operating frequency for acceptable filtering. Unfortunately, typical state of the art capacitor structures formed with any substantial capacitance in a typical CMOS (e.g., UTSOI) technology have been inadequate and problematic.

Prior art discrete on-chip capacitor structures include an FET wired as a capacitor, typically called a MOSCAP. The drain and source diffusions of a MOSCAP FET are wired together to form one capacitor terminal and the FET gate is the other terminal. The MOSCAP per unit area capacitance is principally determined by the gate dielectric thickness. The MOSCAP electrical response is determined by its capacitance and the effective impedance between it and external circuitry. Conventional MOSCAP designs are, therefore, less effective in UTSOI, especially for high speed or fast switching applications, because of the larger time constant associated with the fully depleted FET body.

One alternative to the MOSCAP is the junction capacitor. Junction capacitors, in addition to being voltage varying, are leaky and form only at a PN junction, e.g., in the SOI surface layer. Typically such a junction capacitor includes a contact on the upper surface to a diffusion (i.e., a source/drain diffusion region) and a second contact to the other side of the junction at the surface layer adjacent to the diffusion. However, the junctions leak and capacitance for a junction capacitor is typically smaller than for the same sized MOSCAP. So, besides requiring larger areas for the same capacitance than MOSCAPS, the leaky junctions reduce their usefulness. Finally, because the UTSOI body is fully-depleted, it does not contain mobile charge. This lack of mobile charge means that the junction capacitor terminal at the body connection is ineffective.

Yet another alternative for a UTSOI capacitor is formed from adjacent wiring layers. Capacitors formed on adjacent wiring layers have, by comparison, low per unit area capacitance that may vary widely for very poor tolerance. Consequently, none of these prior art parallel plate capacitors are sufficiently dense or have a high enough per unit area capacitance for efficient decaps or vary to widely to be useful in UTSOI circuit design.

Thus, there is a need for on-chip high-Q capacitors suitable for analog circuit application or in decoupling (decaps) and, more particularly for smaller, denser discrete capacitors with low resistance plates and contacts directly available to both capacitor plates.

SUMMARY OF THE INVENTION

It is a purpose of the invention to reduce on-chip supply noise;

It is another purpose of the invention to decouple SOI CMOS circuits on-chip;

It is another purpose of the invention to fabricate discrete high-Q capacitors for analog circuits on SOI ICs;

It is yet another purpose of the invention to fabricate high-Q discrete capacitors on SOI ICs for analog circuits and for decoupling circuits on-chip.

The present invention relates to a semiconductor structure that may be a discrete capacitor, a Silicon On Insulator (SOI) Integrated Circuit (IC) including circuits with discrete such capacitors and/or decoupled by such discrete capacitors and an on-chip decoupling capacitor (decap). One capacitor plate may be a well (N-well or P-well) in a silicon bulk layer or a thickened portion of a surface silicon layer. The other capacitor plate may be doped polysilicon and separated from the first capacitor plate by capacitor dielectric, e.g., CVD or thermal oxide. Contacts to each of the capacitor plates directly connect and extend from the respective plates, such that direct contact is available from both plates.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
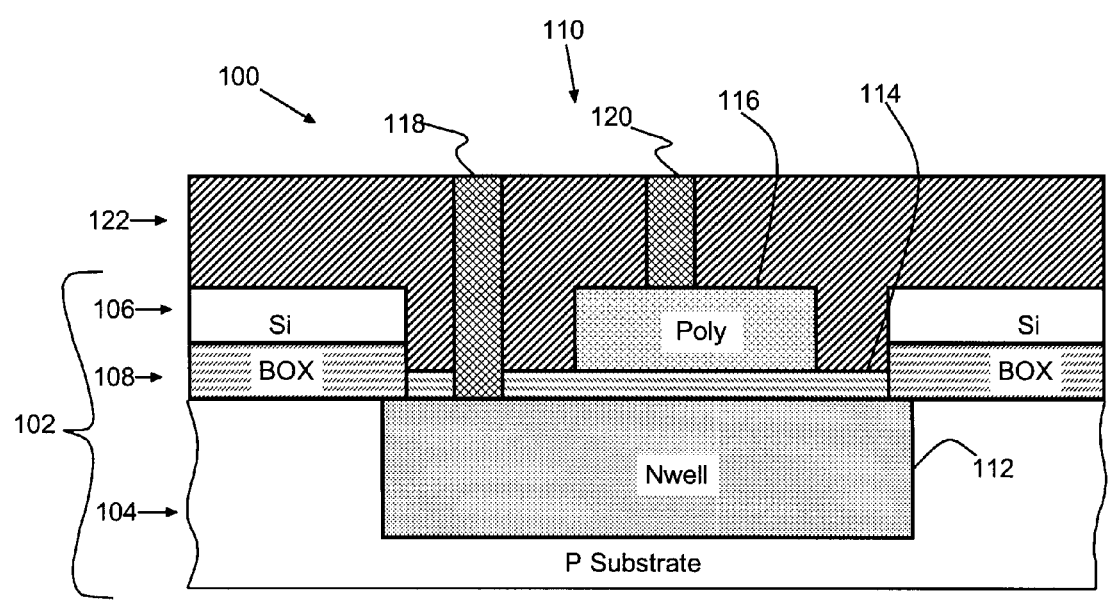
FIG. 1A shows a first example of a semiconductor (SOI) high-Q capacitor according to a preferred embodiment of the present invention.

Turning now to the drawings and, more particularly, FIG. 1A shows a first example of a discrete semiconductor (e.g., silicon) on insulator (SOI) high-Q capacitor 100 according to a preferred embodiment of the present invention. Thus, the preferred SOI high-Q capacitor 100 is formed in the surface of a SOI wafer 102 that includes a bulk silicon layer or silicon substrate 104 and surface layer 106 separated by a dielectric layer 108, a buried oxide (BOX) layer in this example. The capacitor is formed in an orifice 110 through the surface layer 106 and BOX layer 108 to the silicon substrate layer 104. A doped well 112 in the silicon substrate 104 forms one capacitor plate, e.g., an N-well 112 in a P-doped substrate 104. A capacitor dielectric 114 (e.g., thermal oxide) is formed on the upper surface of the silicon substrate 104 in the orifice 110. A second capacitor plate 116 (e.g., polysilicon or a metal) is disposed on the capacitor dielectric 114, preferably doped with the same dopant type as the first plate 112. Plate contacts 118, 120 from each of the plates 112, 116, respectively, extend upward through an interlevel dielectric layer 122. The preferred High-Q capacitor 100 may be connected through plate contacts 118, 120 to a local circuit, e.g., as a decoupling capacitor tied between a supply voltage ($V_{dd}$) and supply return or ground. For additional isolation, preferably, plate 112 is tied to $V_{dd}$ and plate 116 is tied to ground to maintain a reverse bias across the junction at the lower plate 112 and substrate 104, e.g., with the substrate tied to ground.

Figure 1B:
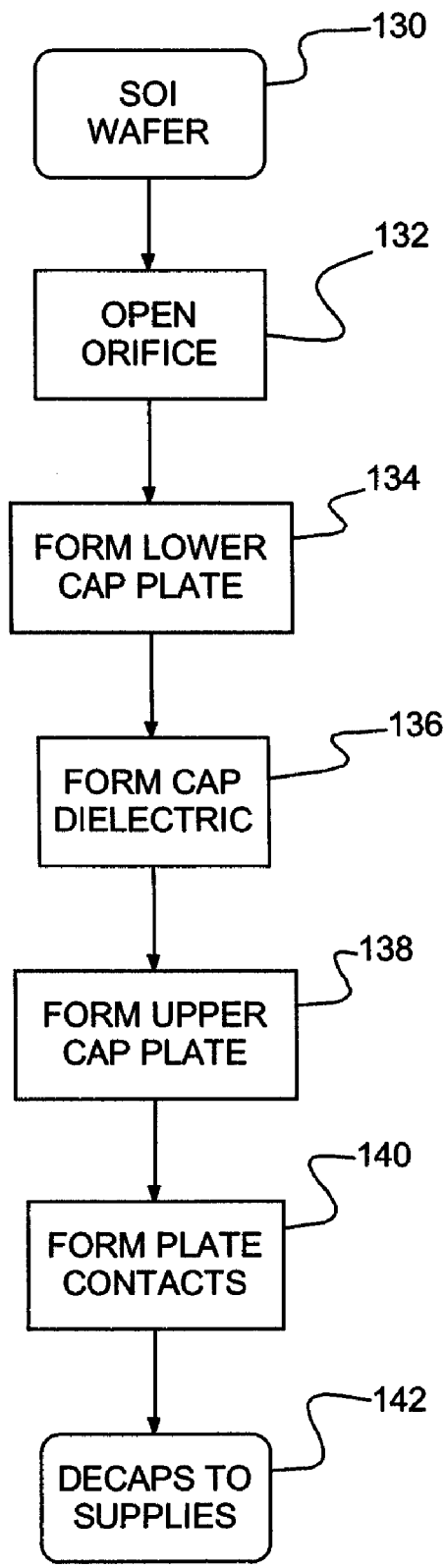
FIG. 1B shows the steps in forming a preferred SOI high-Q capacitor.

FIG. 1B shows the steps in forming preferred SOI high-Q capacitors, e.g., 100 in FIG. 1A. Preferably, the SOI high-Q capacitors 100 are formed coincident with forming circuit devices (not shown) in the surface silicon layer 106, with appropriate device formation steps being carried out at each of or between the capacitor definition steps. However, preferred SOI high-Q capacitors may be completely defined and formed prior or subsequent to defining and forming circuit devices in the surface silicon layer 106.

Capacitor formation begins with a semiconductor wafer in 130, preferably a SOI wafer. A mask is formed on the surface of the wafer in step 132 to define capacitor locations 100 and protect active areas. Capacitor orifices (e.g., 110) are opened through to the underlying semiconductor substrate (104), e.g., etching the surface silicon layer 106 and insulator layer 108. This step of opening capacitor orifices 132 may be done coincidentally with shallow or deep trench definition, for example. Continuing to step 134, first capacitor plates 112 are formed, e.g., implanting and diffusing dopant in the exposed substrate 104 to form wells, N-type or P-type wells, depending upon the selected substrate 104 and dopant type. Preferably, the wells (plates 112) are heavily doped to minimize series resistance. Optionally, a sacrificial layer (not shown) may be formed on the exposed plates prior to implanting the dopant. The optional sacrificial layer, preferably a protective dielectric layer (e.g., an oxide layer), minimizes crystal damage to the exposed plates 112 and is removed after implant and preferably after diffusing the dopant.

After removing the optional sacrificial layer, if included, in step 136 a capacitor dielectric 114 is formed on the first capacitor plates 112, e.g., thermally forming oxide in the orifices 110 on the exposed upper surface of the wells. In step 138, the second capacitor plates 116 are formed on the capacitor dielectric 114. Once the second capacitor plates 116 are formed and doped, the previously formed (in step 132) mask is removed and a layer of plate material is formed on the wafer, e.g., depositing polysilicon or metal in chemical vapor deposition (CVD). The plate material may be doped after deposition with an ion implant dopant step or in situ doped (N+ or P+ depending upon the dopant type for the first capacitor plates 112) during deposition. Then, the gate material layer, which may be a common gate layer or, a layer formed in an extra individual plate step, is masked and patterned to define the second or upper capacitor plates 116 in the orifices 110.

Thus having completed capacitor definition, plate contacts 118, 120 are formed in step 140. At this point, if circuit devices have not yet been formed on the surface layer 106, circuit devices are formed and an inter-layer dielectric (ILD) layer 122 is formed on the wafer. Then, contacts 120 are opened through the ILD layer 122 to the upper capacitor plates 116. Contacts 118 are opened through the ILD layer 122 with contacts 120 and, further, through the capacitor dielectric layer 114 to the lower capacitor plates 112. Finally, in step 142 appropriate connections are made to the capacitors 100. Although shown in this example as being connected vertically the ILD layer 122, this is for example only. Connection may be made to preferred capacitors using any suitable contact. Thus, the capacitors 100 may be connected, for example, in series in a capacitive signal divider, as a capacitor in an RC filter developing a reference voltage for a voltage controlled oscillator (VCO) or as decaps connected between a supply line and ground.

Figure 2A:
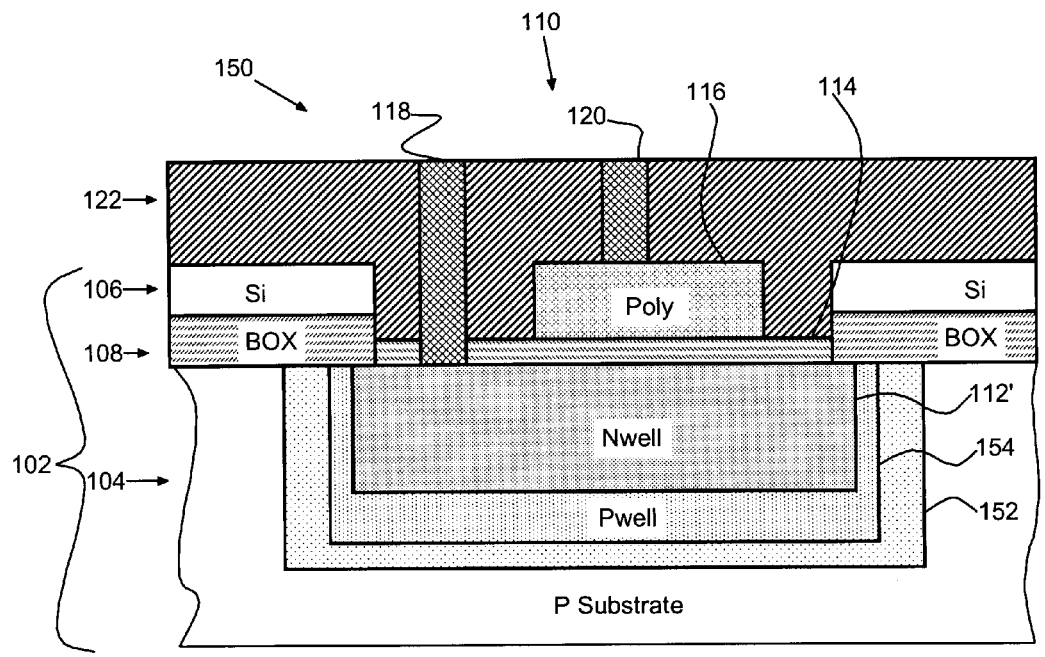
FIGS. 2A-B show multi-well examples of a second preferred embodiment SOI high-Q capacitor with a multiple wells forming the lower plate.
Figure 2B:
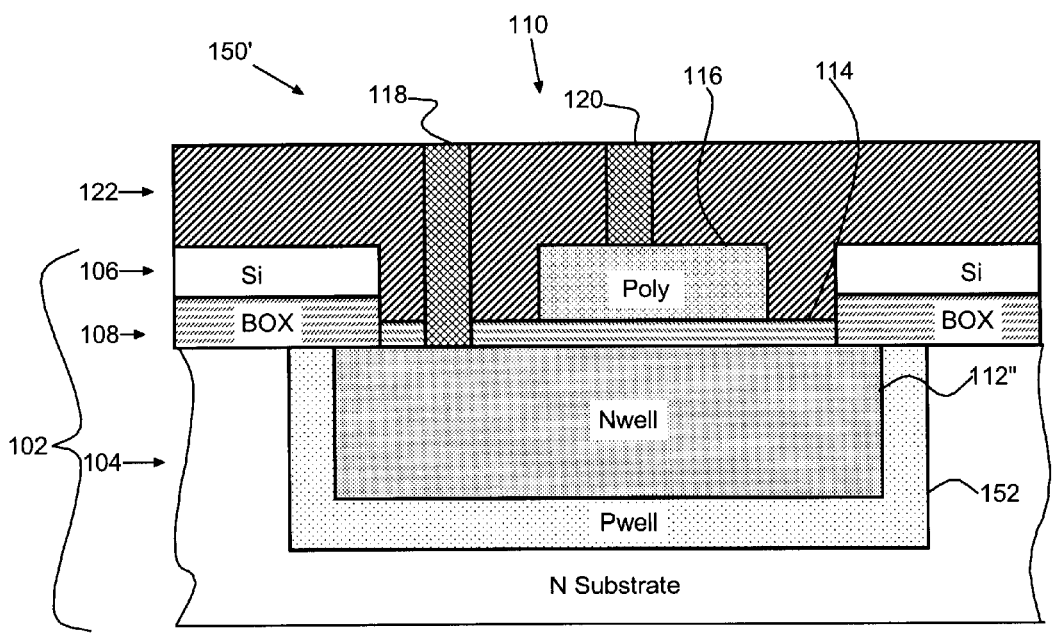

FIGS. 2A-B show multi-well examples of a second preferred embodiment SOI high-Q capacitor with a multiple wells forming the lower plate, substantially similar to the SOI high-Q capacitor 100 of FIG. 1 with like features labeled identically. In the example of FIG. 2A, the SOI high-Q capacitor 150 is formed in step 134 with an additional pair of alternating dopant type wells 152, 154, are implanted and diffused prior to implanting the lower plate well 112'. In the example of FIG. 2B, the SOI high-Q capacitor 150' is formed in step 134 with a pair of wells 152 and 112" and with appropriate well type selection, i.e., N-type diffusion in a P-well in an N-type substrate or P-type diffusion in a N-well in a P-type substrate. For these multiple well examples, however, the additional well junctions form a series of back-to-back diode junctions, e.g., 104-152, 152-154 and 154-112'; or, 104-152 and 152-112". The multiple well structures 150', 150" may be formed by spacing implant dopant peaks for each well, 152, 154, 112'/112". The lower plate 112' or 112" is separated from the substrate 104 by the additional wells 152, 154, e.g., to better isolate local supply noise at the plate 112' or 112" from noise at other capacitor plates.

Figure 3:
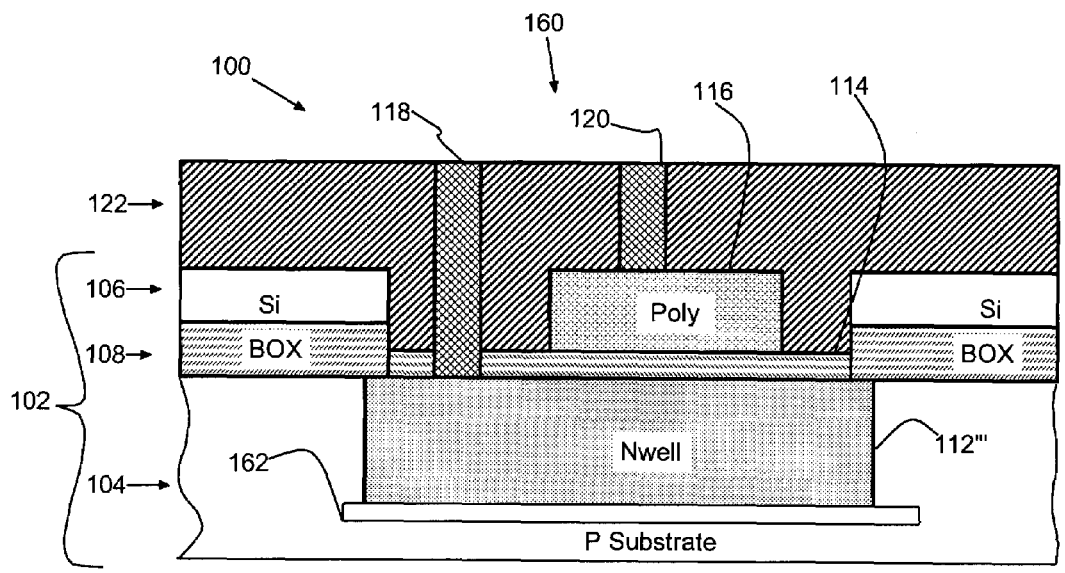
FIG. 3 shows another example of a preferred embodiment SOI high-Q capacitor with a single layer lower plate isolated by an underlying dielectric layer.

FIG. 3 shows another example of a preferred embodiment SOI high-Q capacitor 160 with a single layer lower plate 112''' isolated by an underlying dielectric layer 162 and substantially similar to the SOI high-Q capacitor 100 of FIG. 1 with like features labeled identically. So, for further isolation in this example, the plate 112''' is isolated by a junction at its sides and by the underlying dielectric layer 162. The underlying dielectric layer 162 may be formed by implanting oxygen in the orifice 110 opened in step 132 and annealing the wafer before forming the plates in step 134. Further, although shown here for a single well SOI high-Q capacitor 160, an underlying dielectric layer may be formed with multiple well high-Q capacitors (e.g., 150, 150') as well.

Figure 4:
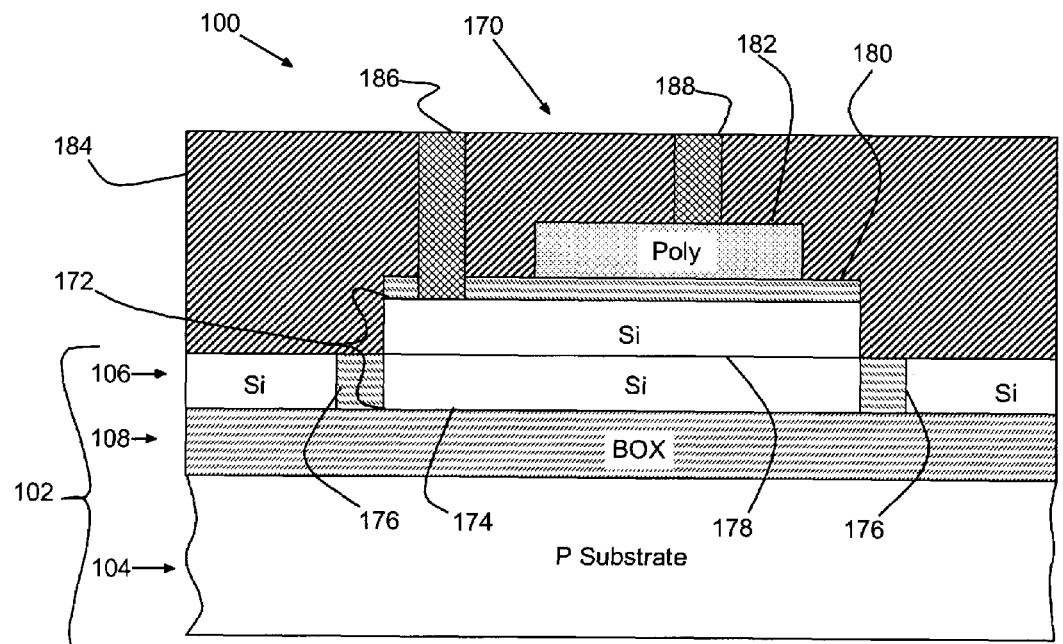
FIG. 4 shows yet another example of a preferred embodiment SOI high-Q capacitor with a lower plate formed in and on the surface silicon layer of the SOI chip/wafer.

FIG. 4 shows yet another example of a preferred embodiment SOI high-Q capacitor 170 with a lower plate 172 formed in and on the surface silicon layer 106 of the SOI chip/wafer 102, instead of in the substrate 104. So in this example, step 132 of FIG. 1B may be omitted; and, proceeding to step 134, the wafer 102 is masked in the decap area to define lower plate portions 174 in the surface layer 106. Then, the lower plate portions 174 are defined and separated from the surface layer 106, e.g., etching for shallow trench isolation (STI) and filling the trenches with oxide 176. This definition may be coincident with defining device islands (not shown) in the surface layer 106. Optionally, after filling with oxide 176, a protective mask may be formed on device regions. A layer of semiconductor material 178 is formed on the lower plate portions 174 (e.g., silicon is epitaxially grown) to complete the lower plate 172. Step 134 is completed by doping the lower plate 172, e.g., in a typical N-well dopant step. The dielectric layer 180 is formed on the lower plate 172 in step 136, e.g., thermally grown or CVD gate oxide. The upper plate 182 is formed on the dielectric layer 180 and defined in step 138, e.g., coincident with CVD of an in situ doped polysilicon gate layer and subsequent gate definition. Alternately, the polysilicon upper plate 182 may be ion implanted subsequent to definition. The interlevel dielectric layer 184 and contacts 186, 188 may be formed substantially as described above in step 140 for discrete capacitor 100.

Advantageously, preferred embodiment discrete capacitors are high-Q capacitors that are easily and seamlessly integrated in FET ICs and, in particular in SOI CMOS ICs.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A silicon on insulator (SOI) integrated circuit (IC) including at least one decoupling capacitor (decap) located at a circuit on said SOI IC, said decap comprising:
    an orifice through a surface silicon layer and an insulator layer beneath said surface silicon layer, said orifice extending to a bulk silicon layer beneath said insulator layer;
    a first capacitor plate in a planar surface of said bulk silicon layer in said orifice;
    a first capacitor contact extending upward through said orifice from said first capacitor plate;
    a capacitor dielectric on said first capacitor plate;
    a second capacitor plate on said capacitor dielectric; and
    a second capacitor contact extending upward from said second capacitor plate.

2. A SOI IC as in claim 1, further comprising an interlevel dielectric layer on said planar surface silicon layer and filling said orifice, said first capacitor contact and said second capacitor contact extending upward through said interlevel dielectric layer.

3. A SOI IC as in claim 2, wherein said first capacitor plate is an N-well in said bulk silicon layer, said capacitor dielectric is thermal oxide and said second capacitor plate is N-doped polysilicon.

4. A SOI IC as in claim 3, wherein said N-well is an upper well in a triple well in said bulk silicon layer.

5. A SOI IC as in claim 3, wherein said N-well is an upper well in a dual well in said bulk silicon layer.

6. A SOI IC as in claim 3, further comprising a dielectric layer beneath said N-well.

7. A SOI IC as in claim 3, wherein one of said first capacitor contact and said second capacitor contact is connected to a supply and the other is connected to a supply return.

\* \* \* \* \*